(12) United States Patent
Kim

(10) Patent No.: US 8,263,440 B2
(45) Date of Patent: Sep. 11, 2012

(54) METHOD FOR FABRICATING ETCHING BARRIER BY USING SHADOW EFFECT AND METHOD FOR FABRICATING ONE SIDE CONTACT OF VERTICAL TRANSISTOR USING THE SAME

(75) Inventor: Jun Ki Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/012,313

(22) Filed: Jan. 24, 2011

(65) Prior Publication Data
US 2012/0009760 A1    Jan. 12, 2012

(30) Foreign Application Priority Data
Jul. 9, 2010    (KR) .................. 10-2010-0066268

(51) Int. Cl.
*H01L 21/332* (2006.01)

(52) U.S. Cl. ........ 438/137; 438/138; 438/430; 257/302; 257/E21.41; 257/E29.262

(58) Field of Classification Search .............. 438/137, 438/138, 156, 173, 206, 209, 212, 268, 270, 438/430; 257/302, 328, E27.054, E27.096, 257/E21.41, E21.447, E21.676, E21.693, 257/E29.262

See application file for complete search history.

(56) References Cited

U.S. PATENT DOCUMENTS

| | | | |
|---|---|---|---|
| 6,046,097 A * | 4/2000 | Hsieh et al. | 438/584 |
| 7,339,239 B2 | 3/2008 | Forbes | |
| 2002/0066925 A1 | 6/2002 | Gruening et al. | |
| 2003/0003652 A1 | 1/2003 | Gobel et al. | |
| 2003/0118950 A1 * | 6/2003 | Chao et al. | 430/321 |
| 2004/0029346 A1 | 2/2004 | Jaiprakash et al. | |
| 2005/0020024 A1 * | 1/2005 | Goldbach | 438/386 |
| 2005/0167719 A1 | 8/2005 | Chen et al. | |
| 2007/0254487 A1 * | 11/2007 | Pilchowski | 438/717 |
| 2010/0013005 A1 * | 1/2010 | Roesner et al. | 257/329 |

* cited by examiner

*Primary Examiner* — Khiem D Nguyen
(74) *Attorney, Agent, or Firm* — William Park & Associates Ltd.

(57) ABSTRACT

A method for fabricating an etching barrier includes forming wall bodies with a trench in between the wall bodies in a semiconductor substrate. An etching barrier is formed by performing a deposition having a directionality in an oblique direction with respect to the surface of the semiconductor substrate, wherein one of two bottom edge portions of the trench is not covered by the deposition due to a shadow effect by upper portions of the wall bodies.

15 Claims, 14 Drawing Sheets

METHOD FOR FABRICATING ETCHING BARRIER BY USING SHADOW EFFECT AND METHOD FOR FABRICATING ONE SIDE CONTACT OF VERTICAL TRANSISTOR USING THE SAME

CROSS-REFERENCES TO RELATED APPLICATIONS

The present application claims priority under 35 U.S.C. 119(a) to Korean Application No. 10-2010-0066268, filed on Jul. 9, 2010, in the Korean intellectual property Office, which is incorporated herein by reference in its entirety.

BACKGROUND

The present invention relate to a semiconductor device, and more particularly, to a method for fabricating an etching barrier by using a shadow effect caused by a protrusion structure vertical to a substrate, and a method for fabricating one side contact of a vertical transistor by using the same.

As the integration density of semiconductor devices has been increased, many efforts have been made to integrate a larger number of unit elements, such as transistors, within a limited area of a substrate. In the case of a memory device such as a DRAM device, attempts have been made to implement a single memory cell in a unit area of $4F^2$ (where F is a minimum feature size). To this end, a vertical transistor has been proposed. In the vertical transistor, an active area structure protruding vertically from the substrate, e.g., an active pillar, is formed and a channel is formed vertically to the protrusion-shaped active region, instead of integrating a cell transistor on the surface of the substrate.

A vertical transistor may be understood as a structure in which junctions for source and drain are formed at upper and lower portions of a vertical pillar, respectively, and a gate is formed on a sidewall of the pillar. In a case in which a DRAM memory cell includes a vertical transistor and a capacitor, a drain junction may be positioned at a lower portion of the vertical pillar. Accordingly, a bit line electrically coupled to the drain junction may be buried within the substrate. Generally, a minimum distance may be desired between bit lines to reduce parasitic capacitance effects between the bit lines. As the integration density of the semiconductor device has increased, the substrate surface area occupied by the memory cell has been greatly reduced.

SUMMARY

An embodiment of the present invention is directed to a method for fabricating one side contact of a vertical transistor, in which a portion of one of two sidewalls of the protruding wall bodies is selectively exposed as a junction, so that the vertical transistor can be integrated on the sidewall, and it contacts a buried bit line, and a method for fabricating an etching barrier which is used during an etching process of exposing the junction.

In one embodiment, a method for fabricating an etching barrier includes: forming wall bodies on a semiconductor substrate, the wall bodies being mutually faced by a trench; and forming an etching barrier by performing a deposition having a directionality in an oblique direction with respect to the surface of the semiconductor substrate, wherein one of two bottom edge portions of the trench is selectively exposed by a shadow effect which partially covers the deposition due to upper portions of the wall bodies.

The forming of the wall bodies may include: performing a selective etching process on the semiconductor substrate to form the trench so that the wall bodies are on both sides of the trench; forming a liner on walls surfaces of the wall bodies, the liner being to be selectively etched by the etching barrier; filling available portions of the trench with a sacrificial layer on the liner to fill a gap between the wall bodies; and reforming the trench by removing the liner and the sacrificial layer so that an upper portion of the liner is exposed to the bottom edge portion of the reformed trench.

The etching barrier may be formed by sputtering deposition. The forming of the etching barrier may include: mounting the semiconductor substrate on a chuck facing a target for the sputtering deposition; and tilting the chuck so that the surface of the semiconductor substrate is sloped with respect to the surface of the target.

The etching barrier may be formed by plasma-enhanced chemical vapor deposition (PECVD).

In another embodiment, a method for fabricating one side contact of a vertical transistor includes: forming wall bodies on a semiconductor substrate, each wall body including an active region, with a first trench in between adjacent wall bodies; forming a first liner on wall surfaces of the wall bodies; forming a sacrificial layer filling the first trench on the first liner; forming a second trench by recessing the first liner and the sacrificial layer, so that an upper portion of the first liner is exposed to a bottom edge portion of the second trench; forming an etching barrier by performing a deposition having a directionality in an oblique direction with respect to the surface of the semiconductor substrate, wherein a first of two bottom edge portions of the trench is selectively covered by the etching barrier, and wherein a second of the two bottom edge portions is not covered by the etching barrier due to a shadow effect by the upper portions of the wall bodies; removing the first liner positioned at the edge portion not covered by the etching barrier; partially exposing the active region by selectively etching lower sidewalls of the wall bodies to form a groove, which is formed between the sacrificial and the wall bodies by the removal of the first liner, as a passage; and forming a bit line contacting the exposed active region.

The forming of the wall bodies may include: forming the first trenches defining the active region by selectively etching the semiconductor substrate; and forming a second liner covering a lower sidewall of the active region and a third liner covering the upper sidewall.

The first liner may extend to cover the third liner and partially cover the second liner adjacent to the third liner.

The partially exposing of the active region may include selectively etching the exposed second liner until the second liner covered by the first liner is exposed to the groove.

The method may further include, prior to the first liner being formed, forming a buried layer on the bottom of the first trench such that an upper portion of the second liner, wherein when the first liner is formed, the first liner extends to partially cover the upper portion of the second liner.

The buried layer may be formed as a sacrificial buried layer to be removed before the bit line is formed. Alternatively, the buried layer may be formed as a conductive layer which is to remain as a portion of the bit line.

The forming of the bit line may include: forming a junction by doping impurities into the exposed active region; and forming a conductive layer contacting the junction, the conductive layer comprising a metal layer.

In another embodiment, a method for fabricating one side contact of a vertical transistor includes: forming wall bodies on a semiconductor substrate with a first trench in between adjacent wall bodies; forming a mask comprising a first region covering a portion of a lower sidewall of the wall body, a second region covering a lower portion of the first region, and a third region covering an upper portion of the first region, the first, second and third regions being formed of different materials; forming a first liner covering the first region and the third region of the mask; forming a sacrificial layer filling the first trench; forming a second trench by recessing the first liner and the sacrificial layer, so that an upper portion of the first liner is exposed to a bottom edge portion of the second trench; forming an etching barrier by performing a deposition having a directionality in an oblique direction with respect to the surface of the semiconductor substrate, wherein one of two bottom edge portions of the trench is not covered by the deposition due to a shadow effect by upper portions of the wall bodies; forming a groove exposing the first region of the mask by removing the first liner positioned at the edge portion not covered by the etching barrier; exposing a portion of a lower sidewalls of the wall bodies by removing the first region of the mask not covered by the etching barrier; and forming a bit line contacting the exposed portion of the lower sidewalls of the wall bodies.

The forming of the mask may include: forming a second liner covering the bottom of the first trench and the sidewalls of the wall bodies; forming a buried layer filling the first trench on the second liner; primarily recessing the buried layer; removing the second liner exposed by the primarily recessed buried layer; forming a third liner, which constitutes the third region of the mask, on the sidewalls of the wall bodies where the second liner is removed; and secondarily recessing the buried layer to expose a portion of the remaining second liner constituting the second region of the mask and the first region of the mask.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
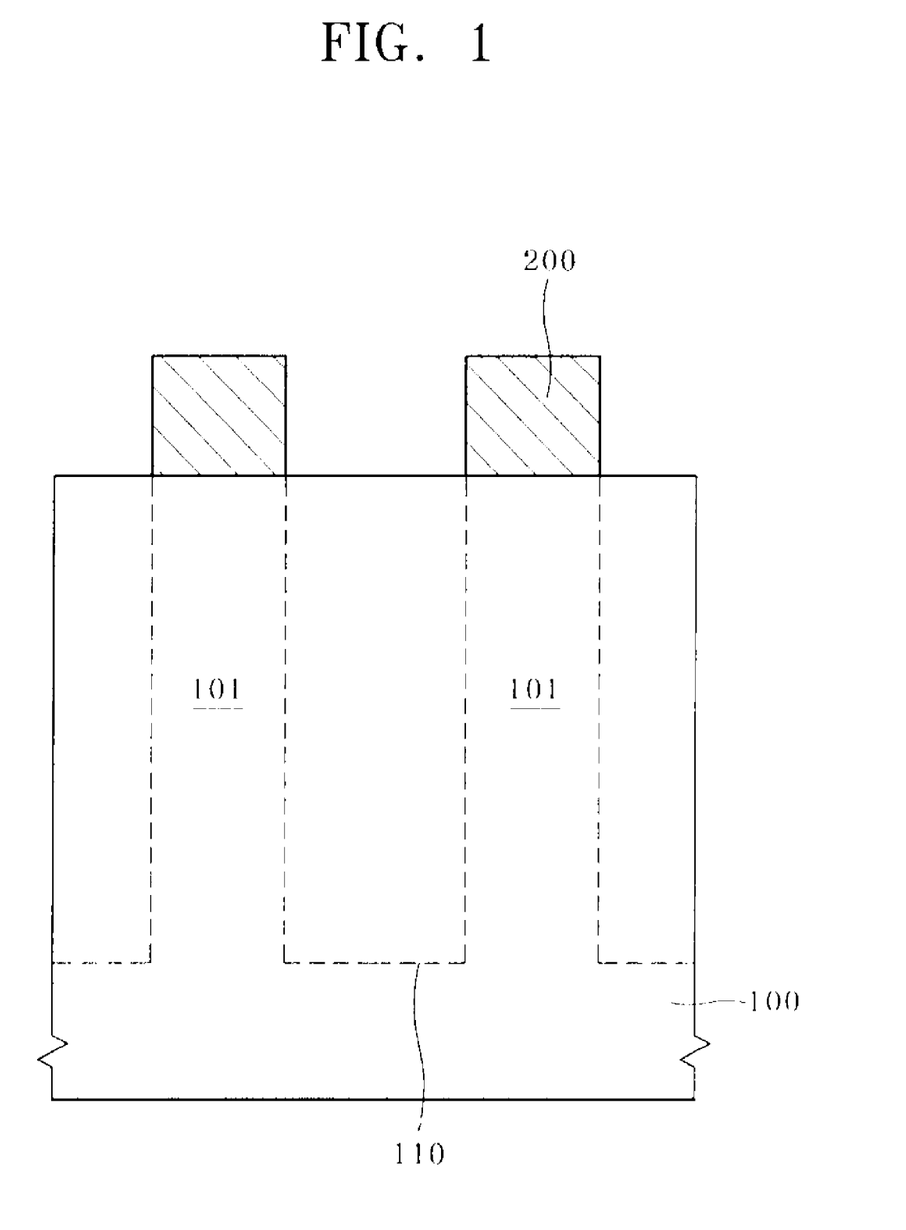
FIGS. 1 to 13 are views illustrating a method for fabricating an etching barrier by using a shadow effect and a method for fabricating one side contact of a vertical transistor by using the same according to an embodiment of the present invention.

Referring to FIG. 1, mask patterns 200 are formed on a semiconductor substrate 100. In the case of a DRAM, the mask patterns 200 may be formed in a line shape elongated in a direction in which a bit line extends. The mask patterns 200 may be used as an etching mask during an etching process of forming a first trench 110 defining an active region 101. Hence, the mask patterns may include silicon nitride ($Si_3N_4$) having an etching selectivity to silicon constituting the semiconductor substrate 100.

Figure 2:
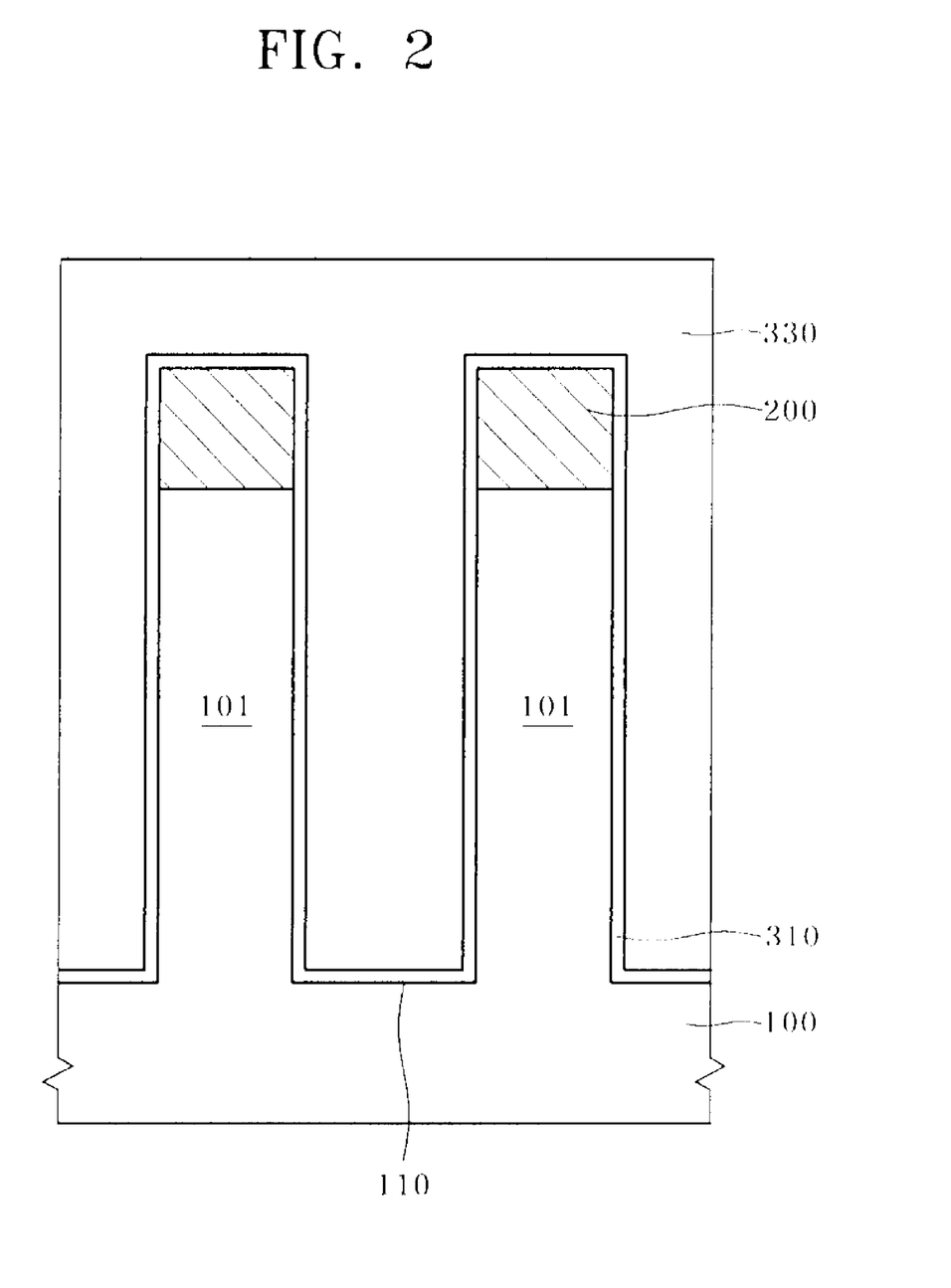

Referring to FIG. 2, a portion of the semiconductor substrate 100 exposed by the mask patterns 200 is selectively etched to form a first trench 110 so that wall bodies including the active region 101 protrude vertically from the surface of the semiconductor substrate 100 in a fence shape. Due to the first trench 110, the wall bodies including the active region 101 are formed to face each other. The sidewall of the first trench 110 is defined by the sidewall surfaces of the wall bodies. Accordingly, the active region 101 has a shape protruding in a direction vertical to the surface of the substrate 100.

A first liner 310 is formed to cover the sidewall of the active region 101 and the bottom of the first trench 110. The first liner 310 may be formed by depositing or thermally oxidizing a layer including silicon oxide ($SiO_2$). The first liner 310 may be provided as a layer for isolating and insulating the active region 101 from a buried bit line which is to fill the bottom of the first trench 110. A buried layer 330 is formed as a sacrificial layer filling the first trench 110. The buried layer 330 may include a material layer such as, for example, a polysilicon layer that may have an etching selectivity substantially similar to the first liner 310.

Figure 3:
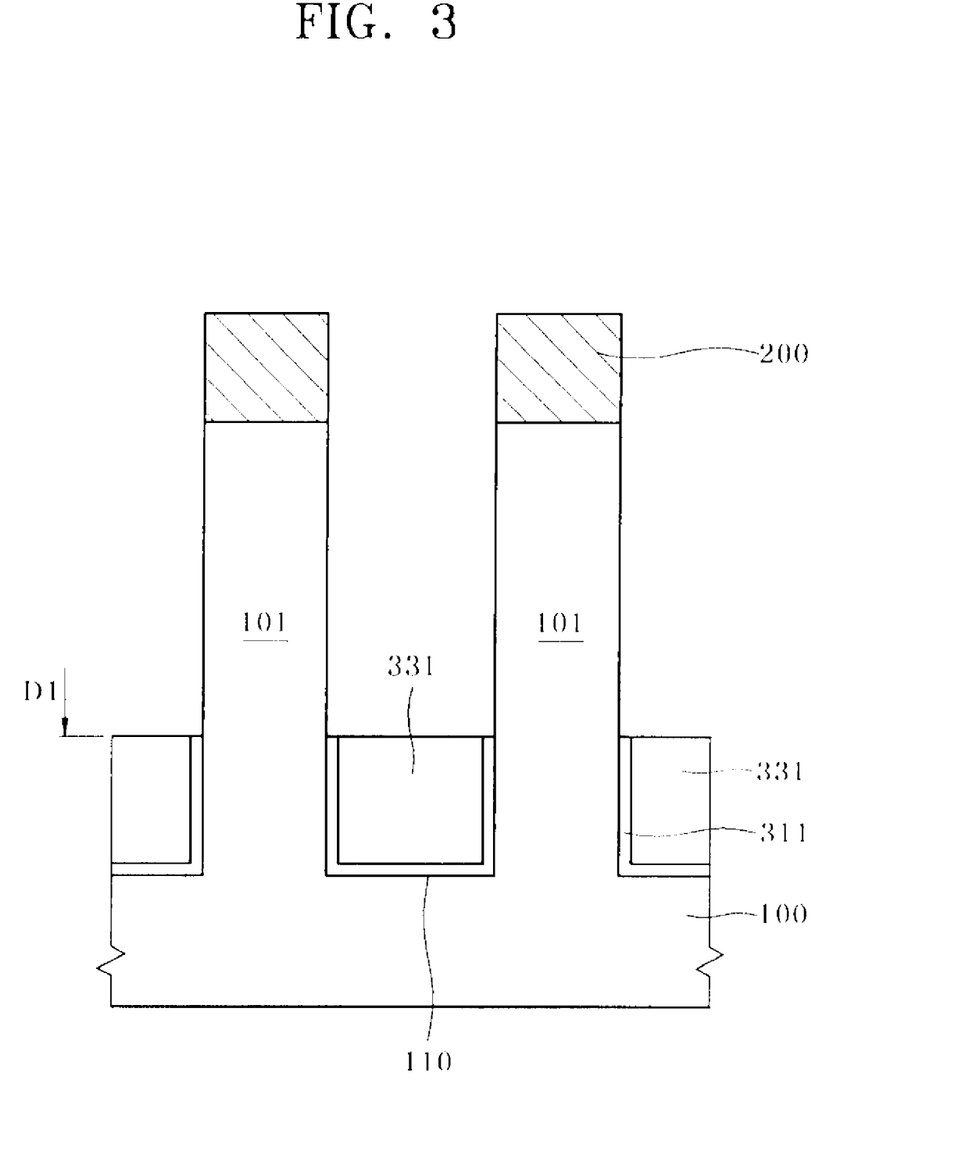

Referring to FIG. 3, portions of the buried layer 330 is primarily recessed, or a portion of the buried layer 330 is removed, so that it is positioned at the bottom of the first trench 110. The remaining portion of the buried layer 330 is called the recessed buried layer 331. At this time, the primary recess is performed so that the top surface of the recessed buried layer 331 is positioned at a first depth D1 within the first trench 110. The first depth D1 is set according to a position of a junction to be used as a drain of a vertical transistor in the active region 101. When the buried layer 331 is primarily recessed, the first liner 310 may be also recessed. However, since the first liner 310 may have an etching selectivity, it is possible to perform a process of selectively etching a portion of the first liner 310 not covered by the primary recess of the buried layer 331. The unetched portion of the first liner 310 may be referred to as the liner 311. Accordingly, the liner 311 remains in the interface between the buried layer 331 and the active region 101.

Figure 4:
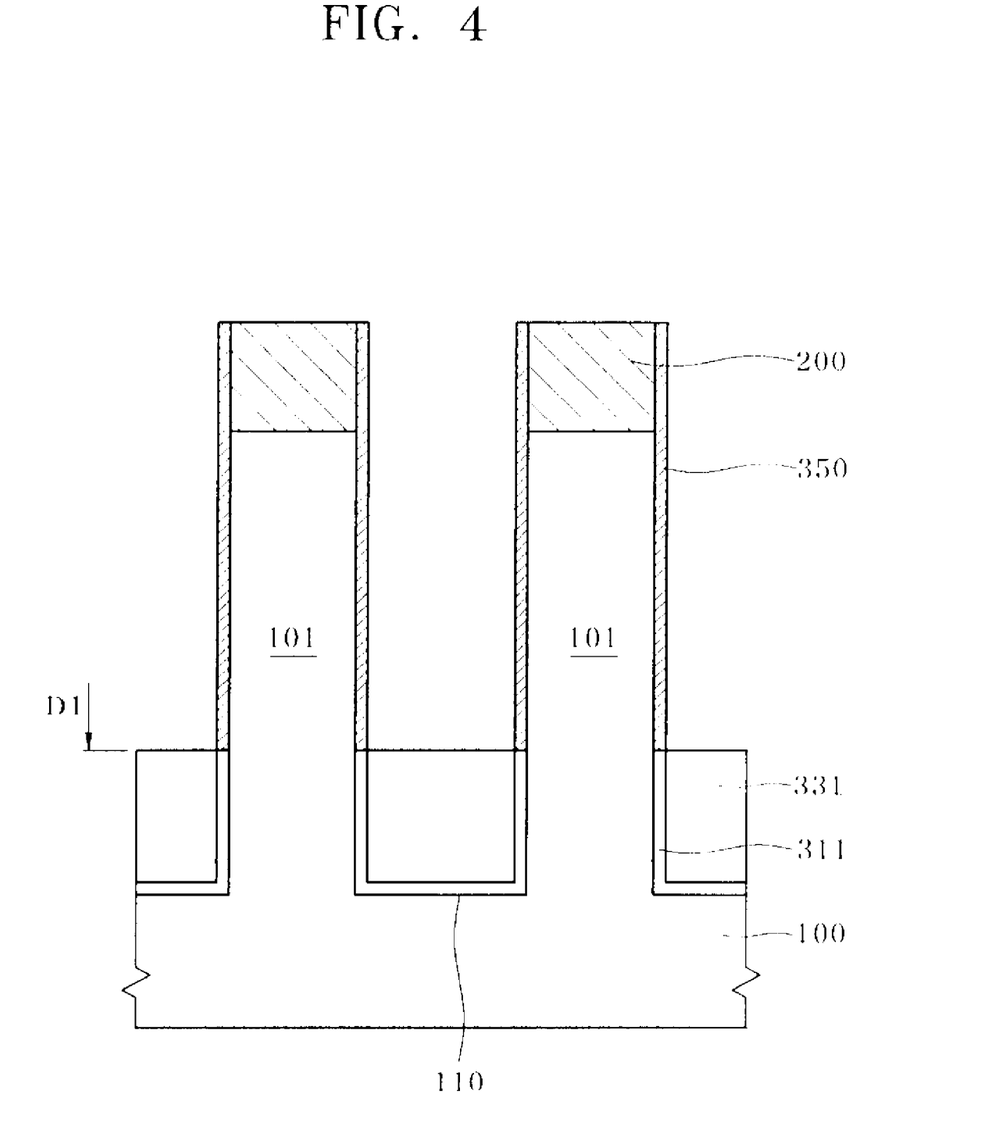

Referring to FIG. 4, a second liner 350 continuously coupled to the liner 311 is formed on the sidewall of the active region 101 exposed by the remaining liner 311 and the buried layer 331. The low portion of the second liner 350 may be at, for example, the first depth D1. The second liner 350 may be formed by depositing a material such as, for example, silicon nitride that may have etching selectivity different than the liner 311 and performing an anisotropic etching process on the deposited material.

Figure 5:
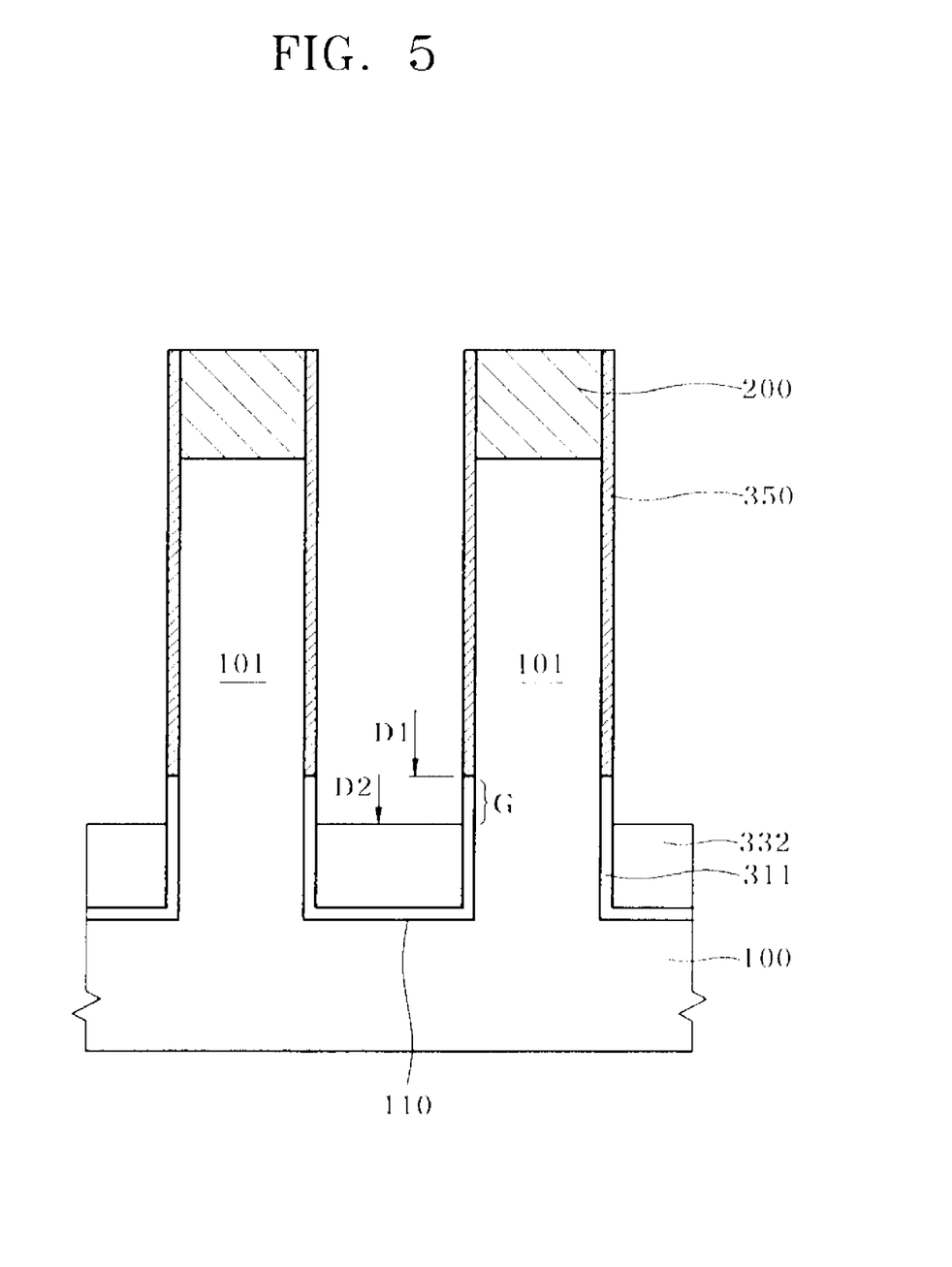

Referring to FIG. 5, the buried layer 331 is secondarily recessed so that the surface thereof is lowered to a second depth D2. Accordingly, a portion G of the liner 311 is exposed from the first depth D1 to the second depth D2. The exposed portion G of the liner 311 is a portion to be one-side etched in a subsequent process of exposing a portion of the active region 101 in which a junction is to be formed. Therefore, the exposed portion G of the liner 311 sets a width of the junction corresponding to the drain of the vertical transistor. The liner 311, the second liner 350, and the buried layer 332 serve as a mask for setting the range of the active region 101 in which the junction is to be formed. That is, the mask may include the liner 311 as a first region covering a portion of the lower sidewall of the active region 101, the buried layer 332 as a second region covering a lower portion of the first region, and the second liner 350 as a third region covering an upper portion of the first region.

Figure 6:
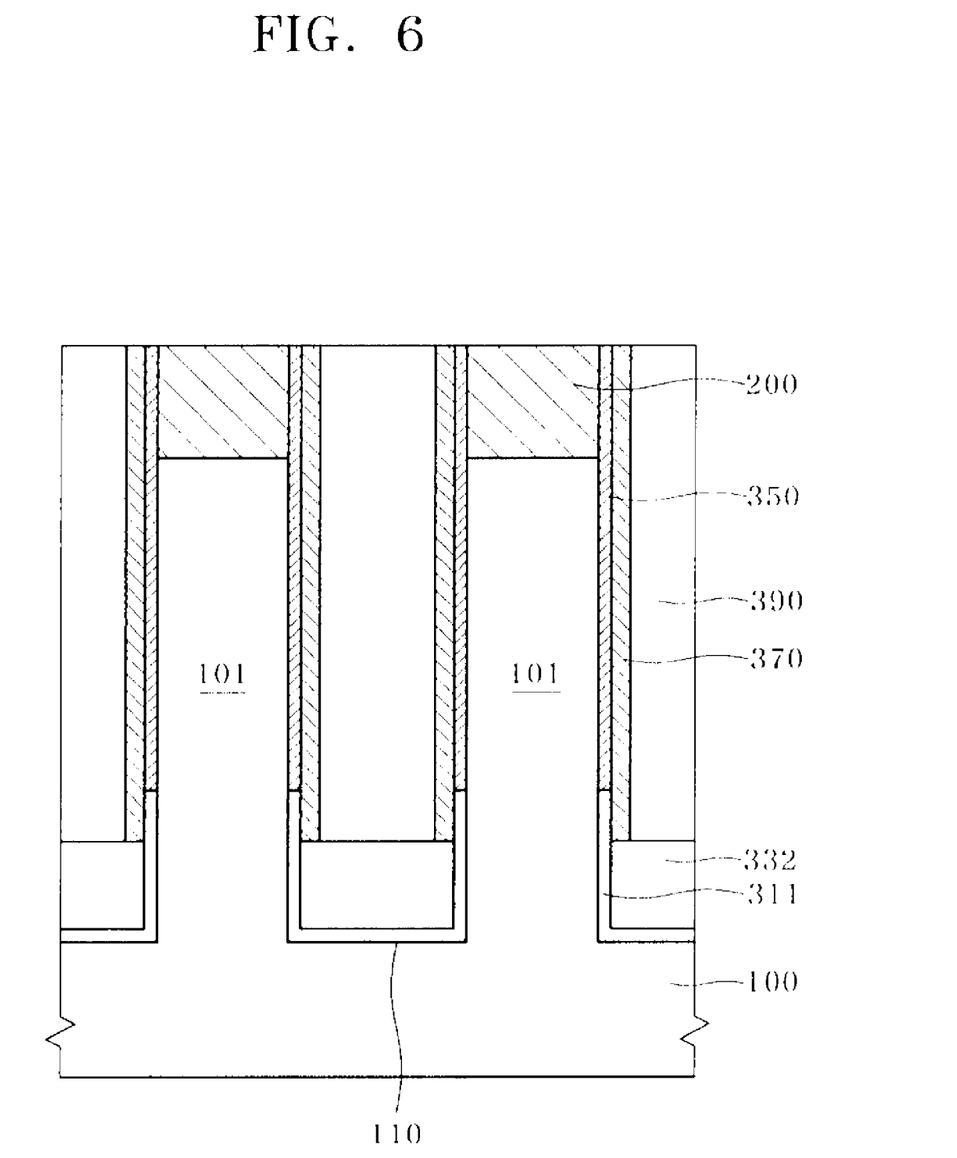

Referring to FIG. 6, a third liner 370 is formed to cover the second liner 350 and the exposed portion G of the liner 311. The third liner 370 is provided to selectively expose the exposed portion G of the liner 311 by selectively etching (one-side etching) a portion positioned at one sidewall of the two active regions 101 facing each other. At this time, since the second liner 350 must be maintained as a mask covering the sidewall of the active region 101, the third liner 370 may include a material having an etching selectivity to the second liner 350, for example, titanium nitride (TiN). The third liner 370 may be formed, for example, by depositing a TiN layer and performing an anisotropic etching process on the deposited TiN layer.

A sacrificial layer 390 filling the first trench 110 is formed on the third liner 370 and the buried layer 331. The sacrificial layer 390 serves as a mask which prevents an unselected third liner 370 from being etched during a one-side etching process of selectively exposing and etching one of two third liners 370 disposed on both sides of the first trench 110. Therefore, the sacrificial layer 390 may be formed by depositing a material having an etching selectivity to the third liner 370, for example, silicon oxide, and performing an etch-back process or a chemical mechanical polishing (CMP) process on the deposited material.

Figure 7:
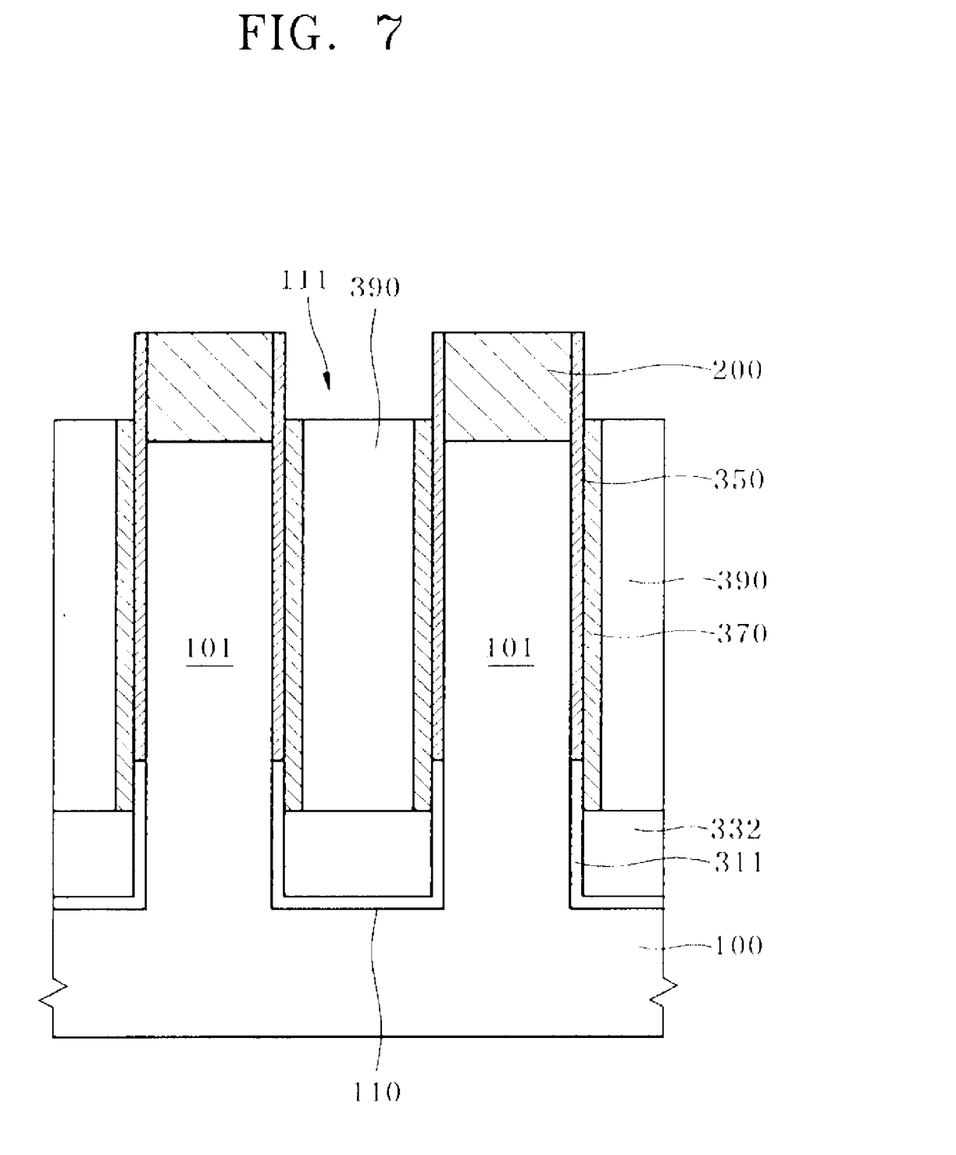

Referring to FIG. 7, the sacrificial layer 390 is recessed. At this time, the third liner 370 may also be recessed. The sacrificial layer 390 is recessed to a predetermined depth, and a second trench 111 is formed, where wall bodies including the active regions 101 and the mask patterns 200 are on both sides of the second trench 111. An end portion of the third liner 370 is exposed at both bottom edge portions of the second trench 111.

Figure 8:
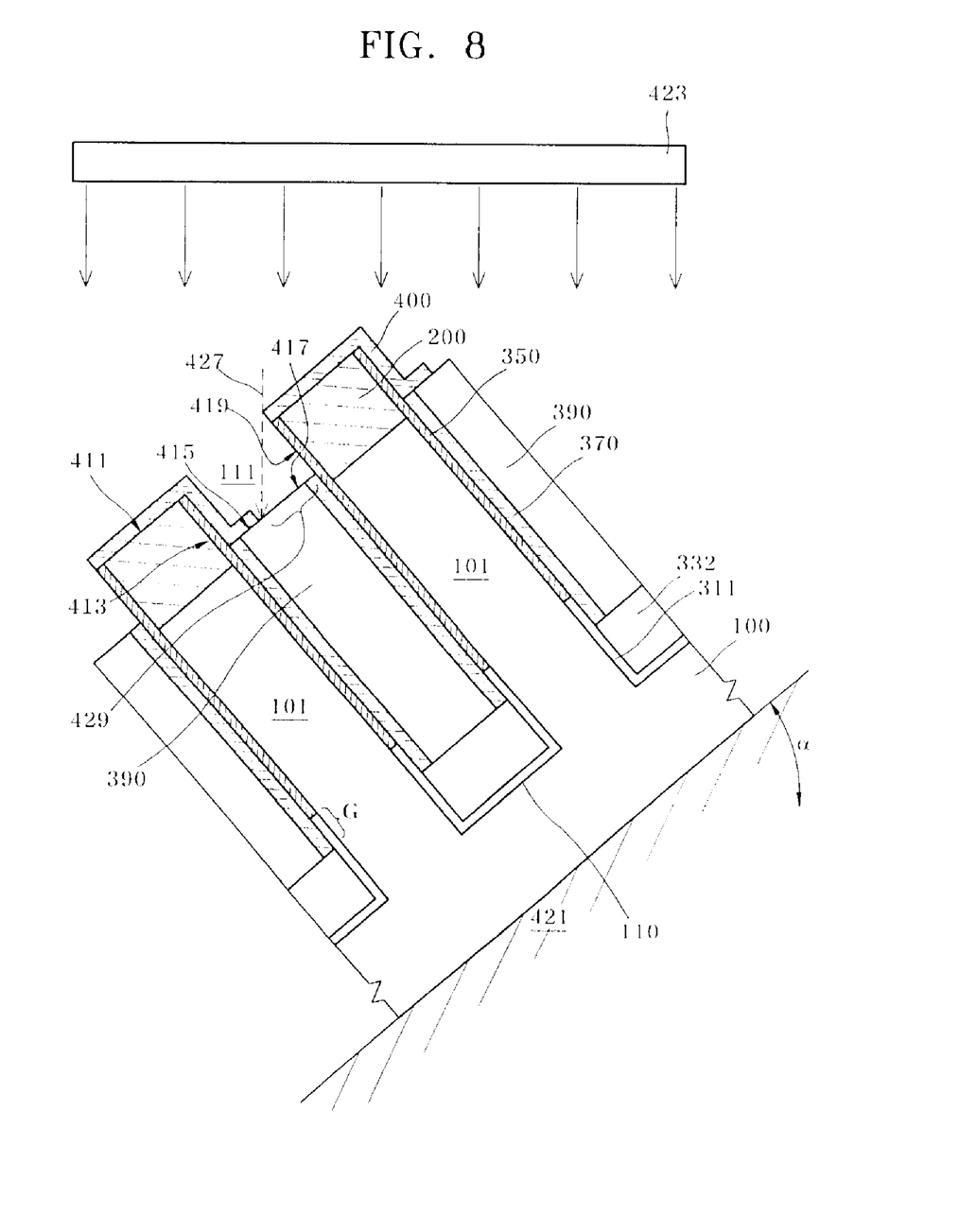

Referring to FIG. 8, an etching barrier 400 is formed to selectively expose one of bottom edge portions 415 and 417 of the second trench 111. The etching barrier 400 may, for example, cover the edge portion 415 and exposes the edge portion 417. When considering the active region 110, a tilt deposition process having orientation is performed in order to form the etching barrier 400 as one-side mask pattern selectively exposing the edge portion 417. Since the deposition process is performed in an oblique direction with respect to the surface of the semiconductor substrate 10, a shadow effect is caused. That is, the deposition direction 427 in which the material is deposited is shadowed by the protrusion of the wall bodies constituting the sidewall of the second trench 111. Due to the shadow effect, a shadow portion 429 shadowing the deposition is formed. Accordingly, an etching barrier 400 exposing the shadow portion 429 is deposited. Due to the shadow effect, the etching barrier 400 naturally covers the top surface 411 of the mask pattern 200, extends on the side surface 413 exposed in the deposition direction 427 of the two side surfaces facing each other, and covers one edge portion 415 of the second trench 111. The other side surface 419 and its adjacent edge portion 417 correspond to the shadow portion 429 and thus they are exposed by the etching barrier 400.

In order to perform the directional deposition in an oblique deposition manner, the etching barrier 400 is formed in a deposition process which can achieve the directional deposition. For example, the substrate 100 is mounted on a chuck 421 of a sputtering apparatus, and the chuck 421 is tilted at an angle α. Therefore, the surface of the chuck 421 is not parallel to the surface of the target 423, but rather is tilted with respect to the surface of the target 423. Also, the surface of the semiconductor substrate 100 and the surface of the target 423 are tilted. At this time, the tilt angle α may be in the range of, for example, substantially 1 degree to substantially 20 degrees. In some cases, the target 423 may be tilted rather than the chuck 421. In other cases, both the chuck 421 and the target 423 may be tilted.

When the target 423 is sputtered and a sputtering deposition occurs on the semiconductor substrate 100 mounted on the chuck 421, the shadow effect may be caused by the directionality of the sputtering deposition from the upper side to the lower side. At this time, the directional sputtering deposition may be further reinforced by applying a bias to the backside of the chuck 421. The sputtering deposition may be performed, for example, by a high density plasma sputtering or a long through sputtering. The high density plasma sputtering uses high density plasma in which the directional deposition is relatively superior. The long through sputtering induces the directional deposition by increasing a distance between the substrate 100 and the target 423. Also, a plasma-enhanced chemical vapor deposition (PECVD) which can achieve the directional deposition may be used.

The etching barrier 400 may substantially include a material which can achieve the oblique deposition and the directional deposition such as the sputtering deposition, for example, a metal layer, a metal oxide layer, a metal silicide layer, and a semiconductor layer. At this time, since the etching barrier 400 must have an etching selectivity different than the third liner 370, the etching barrier 400 may include materials such as, for example, tungsten silicide, silicon, aluminum, aluminum oxide ($Al_2O_3$), germanium, tantalum, tantalum oxide (TaO), and titanium oxide (TiO). The material used for the etching barrier 400 may have an etching selectivity different than that of the material such as, for example, TiN used for the third liner 370. While TiN is etched by a mixed etching solution of sulfuric acid ($H_2SO_4$) and hydrogen peroxide ($H_2O_2$), tungsten silicide does not etch well with the same type of solution. Thus, the etching barrier 400 may be formed using tungsten silicide. In this case, since tungsten silicide has a low etching selectivity, or etches less, compared to TiN, a tungsten silicide layer may serve as a TiN etching barrier even through its thickness is small.

Figure 9:
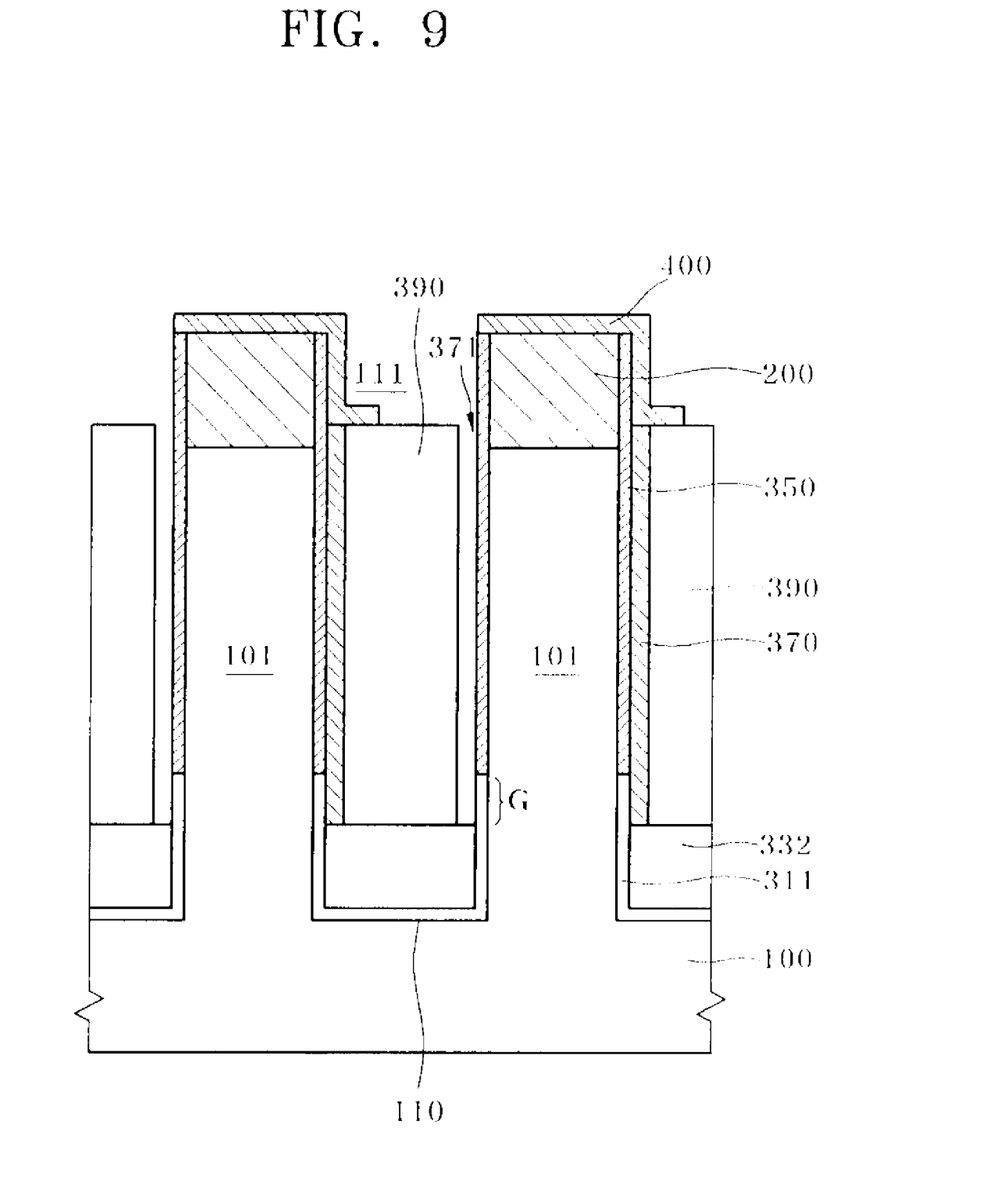

Referring to FIG. 9, the exposed portion of the third liner 370 is selectively etched using the etching barrier 400 as an etching mask. Since the etching barrier 400 only covers one of the two third liner 370 in the second trench 111, one-side etching can be performed. Accordingly, an open passage 371 having a groove shape is formed on one side of the second trench 111, and the exposed portion G of the liner 311 is exposed at the bottom of the open passage 371. A portion of the side of the active region 101 is exposed by selectively etching and removing the exposed portion G of the liner 311.

Figure 10:
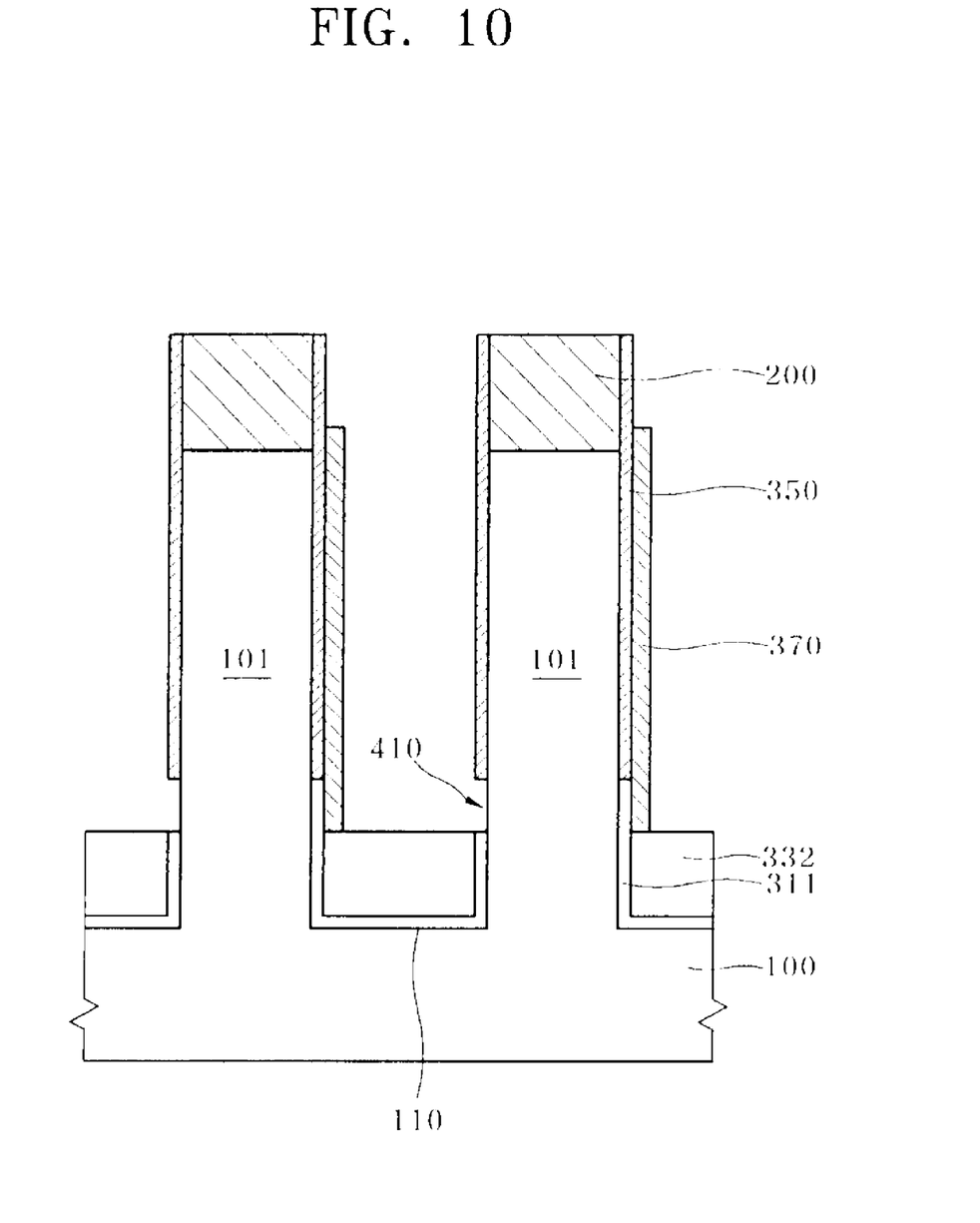

Referring to FIG. 10, the process of removing the exposed portion G of the liner 311 may be performed so that the exposed portion G can be removed together during the process of etching the sacrificial layer 390. Since the sacrificial layer 390 may include substantially the same material as the liner 311, such as, for example, silicon oxide, the exposed portion G of the liner 311 can be etched together during the process of removing the sacrificial layer 390. Accordingly, an opening 410 is formed to open the active region 101 in which a junction is to be formed.

Figure 11:
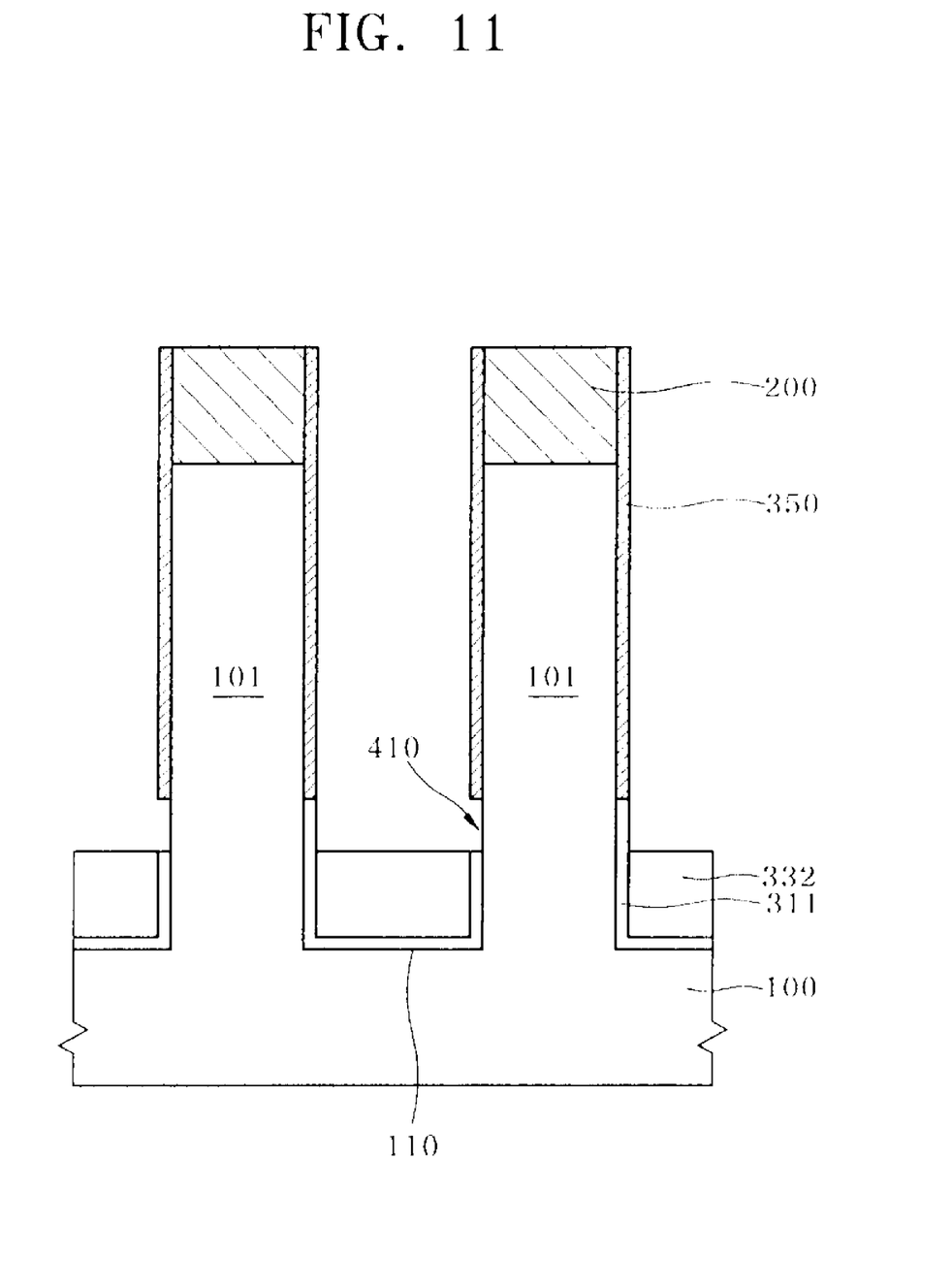

Referring to FIG. 11, the second liner 350 having the spacer shape is exposed by selectively removing the third liner 370 on the opposite sidewall which remains during the process of the sacrificial layer 390 because it has an etching selectivity to the sacrificial layer 390. The buried layer 332 remaining at the lower portion is selectively removed. In various embodiments of the invention, the buried layer 332 is formed using a metal layer or a conductive layer that may be used as a portion of a subsequent bit line. Accordingly, in some embodiments of the invention the buried layer 332 may not need to be removed in order to form the bit line.

Figure 12:
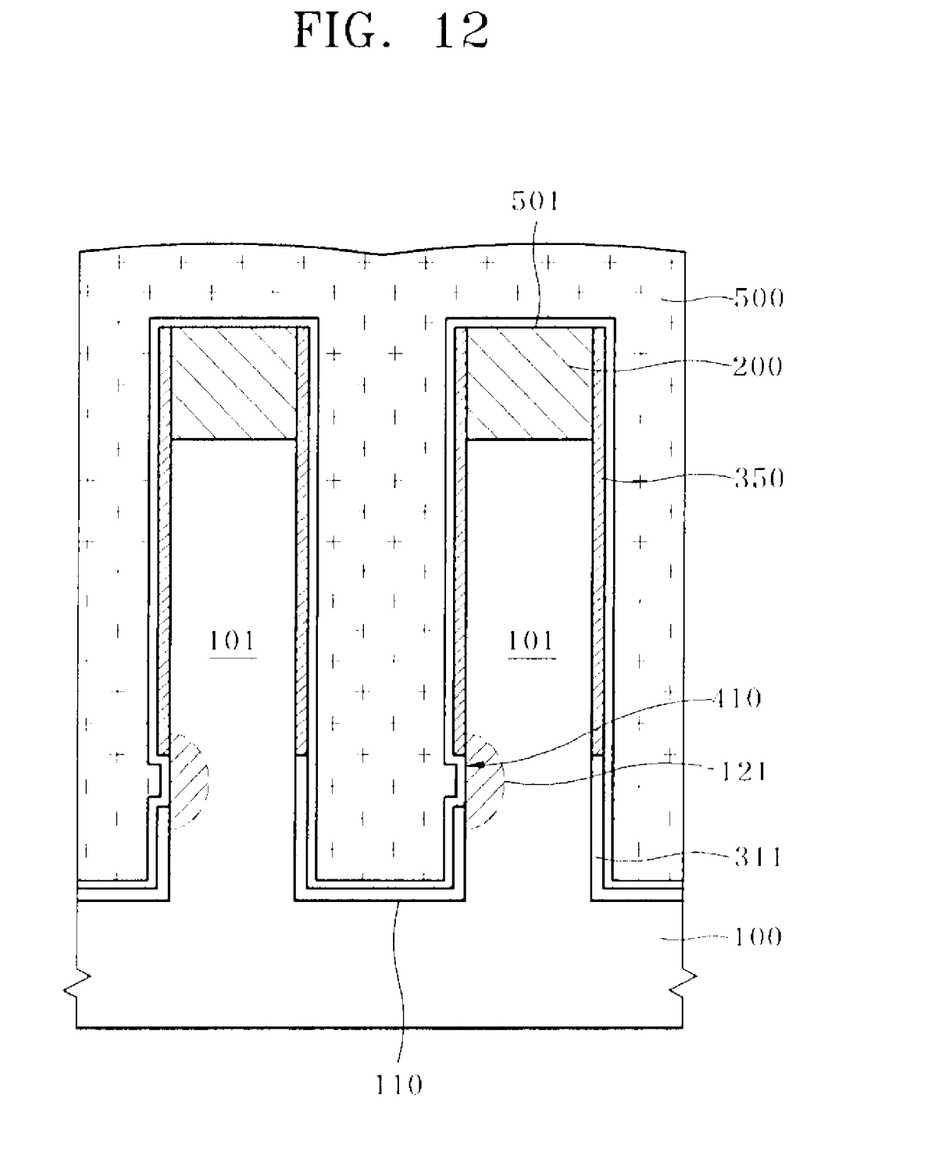

Referring to FIG. 12, a junction 121 to be coupled to a bit line is formed by doping impurities through the opening 410. Such a junction may be used as a contact junction which reduces a contact resistance when it contacts a bit line, and may be used as a drain of a transistor. For the impurity doping, a doping medium layer 500 such as an impurity-doped polysilicon layer is deposited in the first trench 110, and impurities are diffused through annealing to form the junction 121. At this time, in order to suppress excessive progress of the impurity doping for forming the junction 121, a doping barrier 501 may be deposited in a liner shape. The doping barrier 501 may include, for example, titanium (Ti) and serves to suppress excessive diffusion of impurities such as, for example, boron (B). After forming the contact junction 121, the doping barrier 501 and the doping medium layer 500 are selectively removed.

Figure 13:
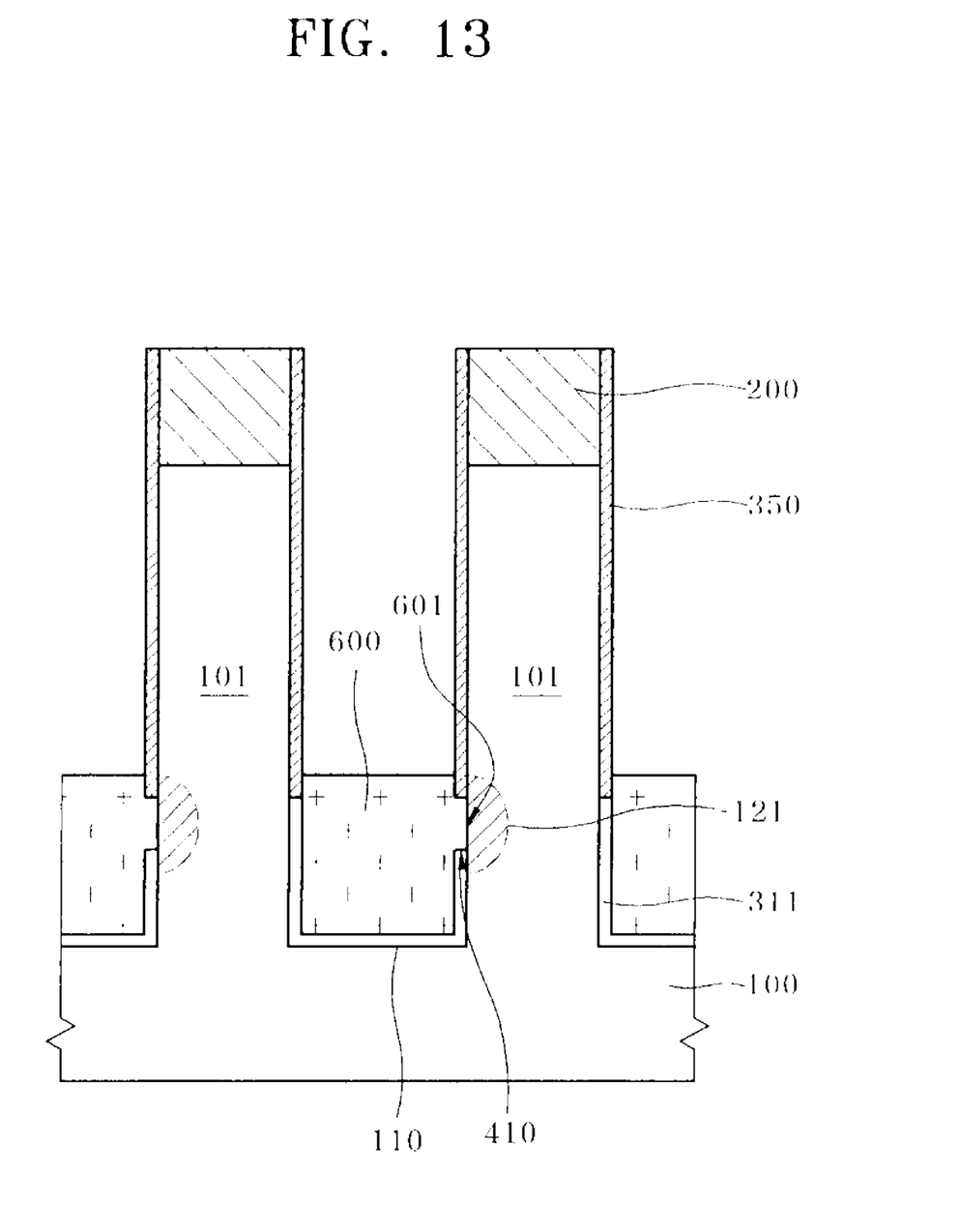

Referring to FIG. 13, a bit line conductive layer, for example, a metal layer such as a titanium nitride layer, is deposited within the first trench 110, and the deposited bit line conductive layer is recessed to form a buried bit line 600. The buried bit line 600 forms a contact 601 contacting the contact junction 121 through the opening 410. In view of the active region 101, one side contact is implemented, that is, the contact 601 is formed in a direction of one sidewall.

Figure 14:
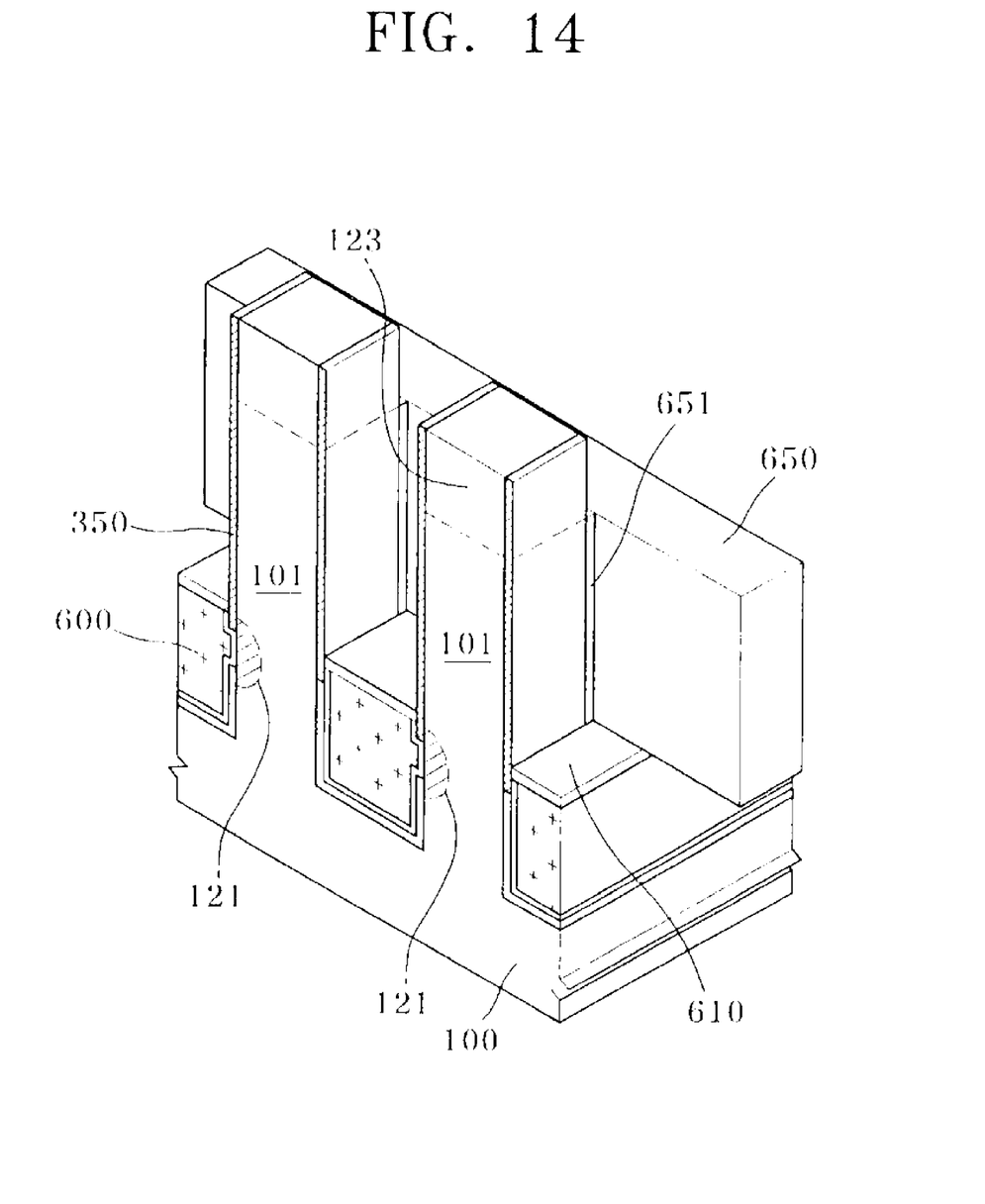
FIG. 14 is a perspective view illustrating a vertical transistor according to an embodiment of the present invention.

Referring to FIG. 14, an insulation layer 610 insulating the buried bit line 600 is formed. A third trench crossing a long-fence-shaped wall body of the active region 101 is formed. In this manner, the active region 101 is separated on a cell basis. Accordingly, the active region 101 is separated in a pillar shape. A gate dielectric layer 651 is formed on a sidewall of the third trench. A gate 650 filling the third trench is formed as a word line. A source 123 is formed at an upper end portion of the active region 101. Consequently, a vertical transistor is manufactured. Also, a capacitor coupled to the source 123 may be integrated to form a DRAM memory cell.

According to the embodiment of the present invention, there is provided a method for fabricating one side contact of a vertical transistor, in which a portion of one of two sidewalls of the protruding wall bodies is selectively exposed as a junction, so that the vertical transistor can be integrated on the sidewall, and it contacts a buried bit line. Also, there is provided a method for fabricating an etching barrier which is used during an etching process of exposing the junction.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating one side contact of a vertical transistor, comprising:
   forming wall bodies on a semiconductor substrate, wherein each wall body comprises an active region, with a first trench in between adjacent wall bodies;
   forming a first liner on wall surfaces of the wall bodies;
   filling the first trench with a sacrificial layer;
   forming a second trench by recessing the first liner and the sacrificial layer, so that an upper portion of the first liner is exposed to a bottom edge portion of the second trench;
   forming an etching barrier by performing a deposition having a directionality in an oblique direction with respect to the surface of the semiconductor substrate, wherein a first of two bottom edge portions of the trench is selectively covered by the etching barrier, and wherein the deposition is performed such that a second of the two bottom edge portions is not covered by the etching barrier due to a shadow effect by upper portions of the wall bodies;
   removing the first liner positioned at the edge portion not covered by the etching barrier;
   partially exposing the active region by selectively etching lower sidewalls of the wall bodies to form a groove, which is formed between the sacrificial and the wall bodies by the removal of the first liner, as a passage; and
   forming a bit line contacting the exposed active region.

2. The method of claim 1, wherein the forming of the wall bodies comprises:
   forming the first trenches defining the active region by selectively etching the semiconductor substrate; and
   forming a second liner covering a lower sidewall of the active region and a third liner covering the upper sidewall.

3. The method of claim 2, wherein the first liner extends to cover the third liner and partially cover the second liner adjacent to the third liner.

4. The method of claim 3, wherein the partially exposing of the active region comprises selectively etching the exposed second liner until the second liner covered by the first liner is exposed to the groove.

5. The method of claim 3, further comprising, prior to the first liner being formed, forming a buried layer on the bottom of the first trench such that an upper portion of the second liner is exposed upward, wherein when the first liner is formed, the first liner extends to partially cover the upper portion of the second liner.

6. The method of claim 5, wherein the buried layer is formed as a sacrificial buried layer to be removed before the bit line is formed.

7. The method of claim 5, wherein the buried layer is formed as a conductive layer which is to remain as a portion of the bit line.

8. The method of claim 3, wherein the first liner comprises titanium nitride (TiN);
   the second liner comprises silicon oxide ($SiO_2$); and
   the third liner comprises silicon nitride ($Si_3N_4$).

9. The method of claim 3, wherein the forming of the etching barrier comprises:
   mounting the semiconductor substrate on a chuck facing a target for sputtering deposition; and
   tilting the chuck so that the surface of the semiconductor substrate is sloped with respect to the surface of the target.

10. The method of claim 2, wherein the etching barrier is one of a group comprising: a metal layer, a metal oxide layer, a metal silicide layer, and a semiconductor layer, wherein the etching barrier has an etching selectivity different than the first liner.

11. The method of claim 2, wherein the etching barrier is formed to have an etching selectivity different than the first liner and is one layer selected from the group comprising: a tungsten silicide layer, a silicon (Si) layer, an aluminum (Al) layer, an aluminum oxide ($Al_2O_3$) layer, a germanium (Ge) layer, a tantalum (Ta) layer, a tantalum oxide (TaO) layer, and a titanium oxide (TiO) layer.

12. The method of claim 2, wherein the etching barrier extends to cover a top surface of the wall body and a top surface of a sidewall of the wall body by the first of the two bottom edge portions.

13. The method of claim 2, wherein the forming of the bit line comprises:
   forming a junction by doping impurities into the exposed active region; and
   forming a conductive layer contacting the junction, wherein the conductive layer comprises a metal layer.

14. A method for fabricating one side contact of a vertical transistor, comprising:
   forming wall bodies on a semiconductor substrate with a first trench in between adjacent wall bodies;
   forming a mask comprising a first region covering a portion of a lower sidewall of the wall body, a second region covering a lower portion of the first region, and a third region covering an upper portion of the first region, the first, second and third regions being formed of different materials;
   forming a first liner covering the first region and the third region of the mask;
   forming a sacrificial layer filling the first trench;
   forming a second trench by recessing the first liner and the sacrificial layer, so that an upper portion of the first liner is exposed to a bottom edge portion of the second trench;
   forming an etching barrier by performing a deposition having a directionality in an oblique direction with respect to the surface of the semiconductor substrate, wherein the deposition is performed such that one of two bottom edge portions of the trench is not covered by the deposition due to a shadow effect by the upper portions of the wall bodies;
   forming a groove exposing the first region of the mask by removing the first liner positioned at the edge portion not covered by the etching barrier;
   exposing a portion of a lower sidewalls of the wall bodies by removing the first region of the mask not covered by the etching barrier; and
   forming a bit line contacting the exposed portion of the lower sidewalls of the wall bodies.

15. The method of claim 14, wherein the forming of the mask comprises:
   forming a second liner covering the bottom of the first trench and the sidewalls of the wall bodies;
   forming a buried layer filling the first trench on the second liner;
   primarily recessing the buried layer;
   removing the second liner exposed by the primarily recessed buried layer;
   forming a third liner, which constitutes the third region of the mask, on the sidewalls of the wall bodies where the second liner is removed; and
   secondarily recessing the buried layer to expose a portion of the remaining second liner constituting the second region of the mask and the first region of the mask.

* * * * *